US010073477B2

(12) United States Patent
Chu

(10) Patent No.: US 10,073,477 B2
(45) Date of Patent: Sep. 11, 2018

(54) APPARATUSES AND METHODS FOR TEMPERATURE INDEPENDENT CURRENT GENERATIONS

(71) Applicant: Micron Technology, Inc., Boise, ID (US)

(72) Inventor: Wei Lu Chu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 71 days.

(21) Appl. No.: 14/421,068

(22) PCT Filed: Aug. 25, 2014

(86) PCT No.: PCT/CN2014/085092
§ 371 (c)(1),
(2) Date: Feb. 11, 2015

(87) PCT Pub. No.: WO2016/029340
PCT Pub. Date: Mar. 3, 2016

(65) Prior Publication Data
US 2016/0252920 A1 Sep. 1, 2016

(51) Int. Cl.
*G05F 1/46* (2006.01)
*G05F 1/59* (2006.01)
(Continued)

(52) U.S. Cl.
CPC ................ *G05F 1/59* (2013.01); *G05F 1/463* (2013.01); *G05F 1/563* (2013.01); *G05F 1/567* (2013.01); *G05F 3/245* (2013.01)

(58) Field of Classification Search
CPC . G05F 1/46; G05F 1/461; G05F 1/462; G05F 1/463; G05F 1/465; G05F 1/567; G05F 1/563
(Continued)

(56) References Cited

U.S. PATENT DOCUMENTS 4,035,693 A * 7/1977 Luxa ........................ H01T 4/08 361/120
4,857,823 A 8/1989 Bitting
(Continued)

FOREIGN PATENT DOCUMENTS

CN 1271116 A 10/2000
CN 103163935 A 6/2013
(Continued)

OTHER PUBLICATIONS

Nebojsa Mrmak, Paul van Oorschot, Jan-Willem Pustjens, Resistor guide, 2012, Retrived from http://www.resistorguide.com/materials/.*

(Continued)

*Primary Examiner* — Timothy J Dole
*Assistant Examiner* — Bryan R Perez
(74) *Attorney, Agent, or Firm* — Dorsey & Whitney LLP

(57) ABSTRACT

Apparatuses and methods for providing a current independent of temperature are described. An example apparatus includes a current generator that includes two components that are configured to respond equally and opposite to changes in temperature. The responses of the two components may allow a current provided by the current generator to remain independent of temperature. One of the two components in the current generator may mirror a component included in a voltage source that is configured to provide a voltage to the current generator.

21 Claims, 4 Drawing Sheets

(51) Int. Cl.
*G05F 1/567* (2006.01)
*G05F 3/24* (2006.01)
*G05F 1/563* (2006.01)

(58) Field of Classification Search
USPC .................................................. 323/312–317
See application file for complete search history.

(56) References Cited

U.S. PATENT DOCUMENTS 4,970,415 A * 11/1990 Fitzpatrick .............. G05F 3/245 323/313
6,087,820 A * 7/2000 Houghton ............... G05F 3/262 323/315
7,274,180 B2 9/2007 Itoh
7,385,453 B2 6/2008 Nervegna
7,514,987 B2 4/2009 Lin
7,636,010 B2 12/2009 Huang
8,264,214 B1 9/2012 Ratnakumar et al.
9,030,186 B2 5/2015 Gupta et al.
2005/0276140 A1* 12/2005 Ogiwara ................ G03B 42/02 365/212
2006/0006927 A1 1/2006 Nakada
2006/0232326 A1 10/2006 Seitz et al.
2007/0036016 A1 2/2007 Takeuchi et al.
2007/0046341 A1* 3/2007 Tanzawa ................ H03K 17/14 327/143
2007/0273407 A1 11/2007 Ueda
2008/0284465 A1* 11/2008 Kao .................... H04L 25/0278 326/30
2009/0121699 A1* 5/2009 Park .......................... G05F 3/30 323/313
2009/0263110 A1* 10/2009 Elliott ....................... H02P 1/16 388/823
2010/0171732 A1 7/2010 Miyazaki
2011/0057718 A1* 3/2011 Snoeij ........................ H03F 1/30 327/512
2011/0102127 A1* 5/2011 Schultes ................... G01L 1/18 338/223
2011/0193544 A1 8/2011 Iacob et al.
2012/0146599 A1* 6/2012 Oyama ............... H02M 3/1588 323/271
2014/0232363 A1* 8/2014 Ueda ....................... G05F 1/465 323/271
2014/0340959 A1* 11/2014 Antonyan ........... G11C 11/1675 365/158

FOREIGN PATENT DOCUMENTS

CN 103681796 A 3/2014
EP 2207073 A2 7/2010
JP 03228365 A 10/1991
JP 09034566 A 2/1997
JP 2004206633 A 7/2004
JP 2009070132 A 4/2009
WO 101650997 A 2/2010
WO 2017015850 A1 2/2017

OTHER PUBLICATIONS

International Search Report and Written Opinion (PCT/ISA/210) issued for PCT/CN2014/05092 dated Jan. 4, 2015.
First Office Action dated Oct. 9, 2017 for Chinese Application No. 201480082104.X.
Notice of Rejection Ground dated Mar. 13, 2018 for Japanese Application No. 2017-510664, pp. all.
First Office Action for KR Application No. 10-2017-7007861, dated Jun. 28, 2018, pp. all.

* cited by examiner

APPARATUSES AND METHODS FOR TEMPERATURE INDEPENDENT CURRENT GENERATIONS

RELATED APPLICATIONS

This application is a 371 National Stage application claiming priority to International Application No. PCT/CN2014/085092, filed Aug. 25, 2014, which application is incorporated herein by reference in its entirety and for any purpose.

BACKGROUND

Current generators are electrical circuits used to produce currents with low variability that may be provided to other circuitry. It may be desirable for the current provided by the current generator to be insensitive to process, voltage, or temperature (PVT) variations. Electrical components' physical properties may change with changing temperature. For example, a resistance of a resistor may increase with increasing temperature. If the resistor is included in a current generator circuit, it may cause variations in the output current as temperature changes. Operational amplifiers and transistors may be used to compensate for temperature variations. Often many additional components are necessary for PVT compensation. This may lead to increases in component costs and increased layout area for the current generator. It may also increase the power consumption of the current generator.

SUMMARY

An example apparatus according to at least one embodiment of the disclosure may include a voltage generator that may be configured to provide a voltage, a current generator that may be coupled to the voltage generator and may be configured to provide a current based on the voltage from the voltage generator, wherein the current generator may include a first component that has a property that may increase as temperature increases and a second component that has the property that may decrease as temperature increases, wherein the second component may be configured to decrease the property at a rate equal to a rate the first component increases the property and wherein the second component may match a resistance of the voltage generator.

An example apparatus according to at least one embodiment of the disclosure may include a voltage generator that may be configured to provide a voltage, an operational amplifier that may be coupled to the voltage generator and may be configured to receive the voltage at an inverting input, a first transistor, a gate of the first transistor may be coupled to an output of the operational amplifier, a second transistor, a gate of the second transistor may be coupled to the output of the operational amplifier, a first resistance may be coupled to a drain of the first transistor, a second resistance may be coupled to the drain of the first transistor, wherein the second resistance, the first resistance, and the drain of the first transistor may be further coupled to a non-inverting input of the operational amplifier, and a diode may be coupled in series with the second resistor, wherein the second resistance and the diode may be matched to a voltage generator diode and voltage generator resistance that may be included in the voltage generator.

An example apparatus according to at least one embodiment of the disclosure may include a voltage generator that may include an operational amplifier, and a voltage generator resistance and a voltage generator diode coupled to the operational amplifier, the voltage generator may be configured to provide a voltage, and a current generator coupled to the voltage generator, wherein the current generator may be configured to provide a bias current based on the voltage; the current generator may include a first component including a first resistance that may increase as temperature increases; and a second component including a second resistance that may decrease as temperature increases, wherein the second component may be configured to decrease the second resistance at a rate equal to a rate the first component increases the first resistance and wherein the second component may match the voltage generator resistance.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure. As used herein, apparatus may refer to, for example, an integrated circuit, a memory device, a memory system, an electronic device or system, a smart phone, a tablet, a computer, a server, etc.

Figure 1:
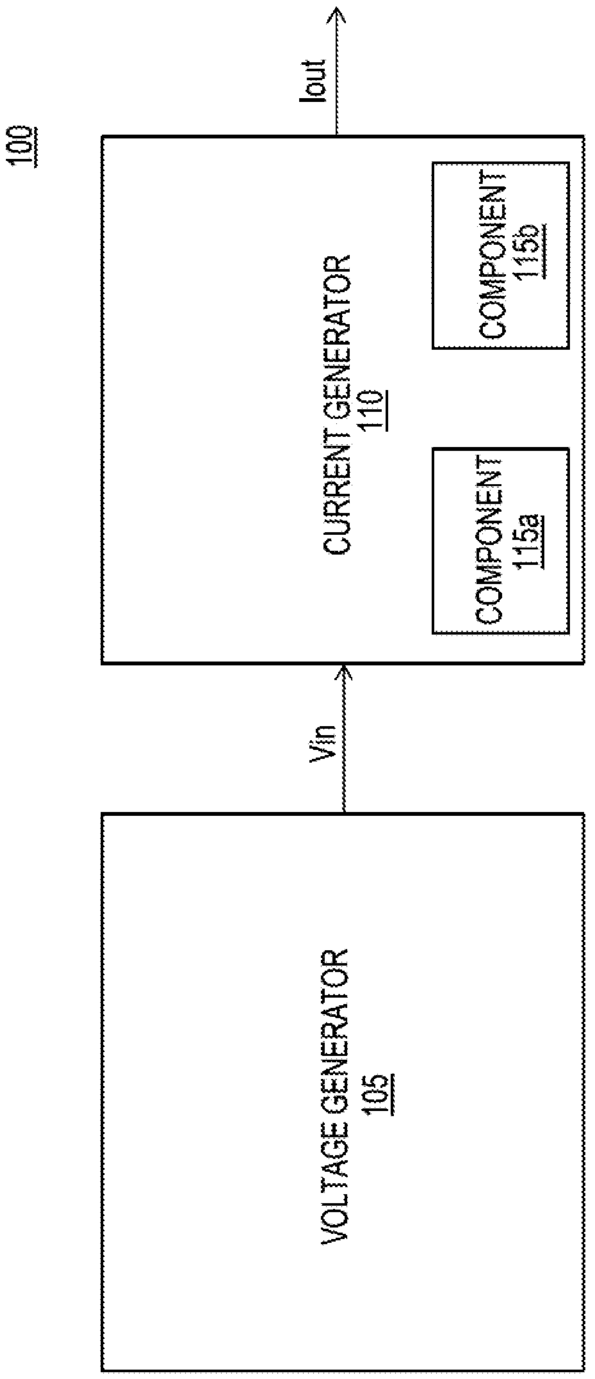
FIG. 1 is a block diagram of an apparatus according to an embodiment of the invention.

FIG. 1 is a block diagram of an apparatus 100 that includes a voltage generator 105 and a current generator 110 according to an embodiment of the disclosure. As used herein, apparatus may refer to, for example, an integrated circuit, a memory device, a memory system, an electronic device or system, a smart phone, a tablet, a computer, a server, etc. The voltage generator may provide a voltage Vin to the current generator 110. The current generator 110 may provide an output current Iout, based at least in part on the voltage Vin. In some embodiments, the current Iout may be provided to an input buffer (not shown in FIG. 1) of a memory device as a bias current or the current Iout may be provided to another circuit that may use a current as an input.

The current generator 110 may include components **115*a*, 115*b*** that respond equally, but inversely to changes in temperature. The equal and inverse responses of these components may allow current Iout to be independent of temperature. The responses may include a change in a property of the component, for example, resistance, capacitance, and/or impedance. Other component properties may also be designed to respond to temperature changes.

Figure 2:
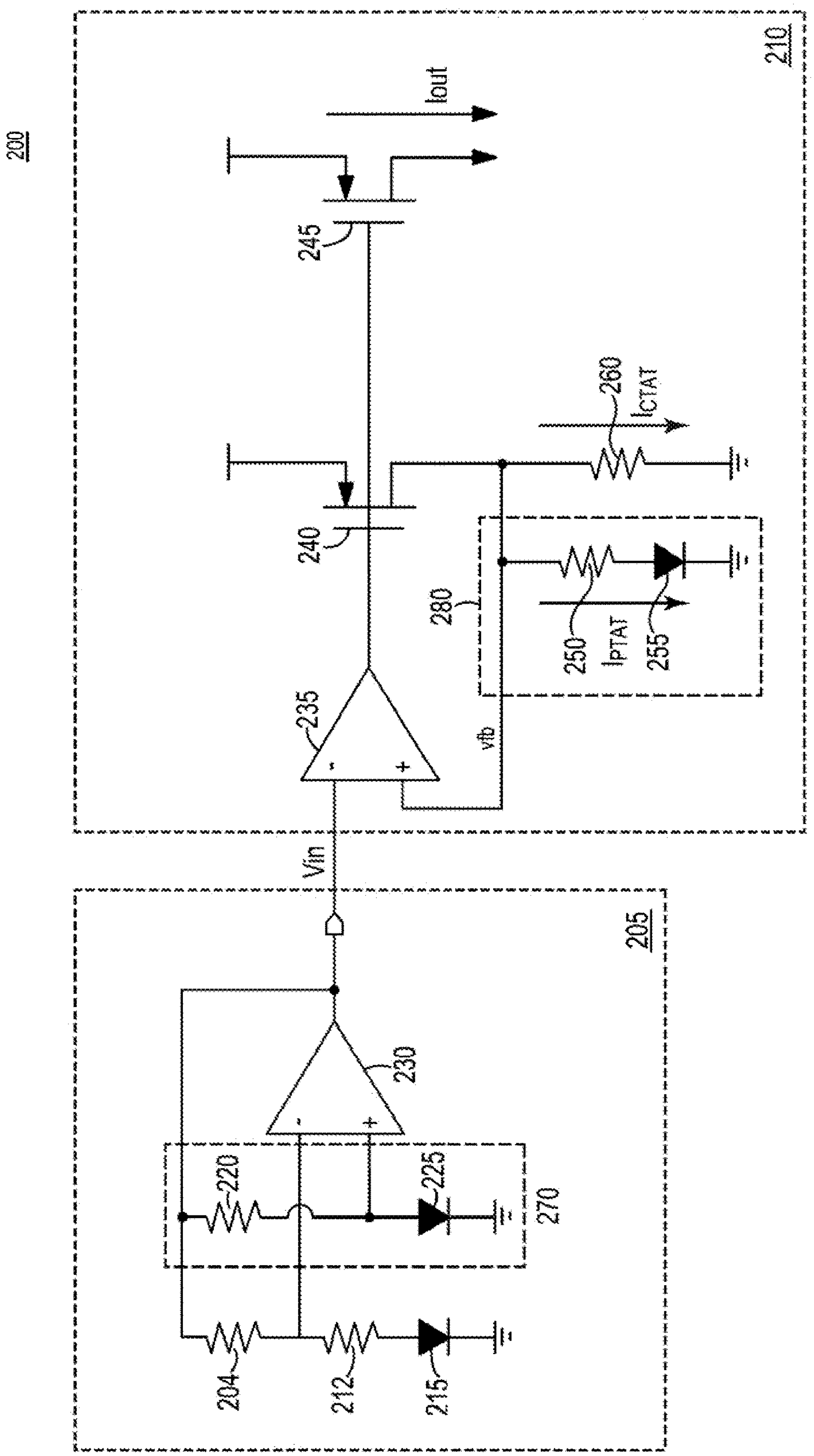
FIG. 2 is a circuit diagram of a current generator according to an embodiment of the invention.

FIG. 2 illustrates a circuit 200 according to an example embodiment of the disclosure. The circuit 200 includes a current generator 210 and a voltage generator 205, which may be used for the current generator 110 and voltage generator 105 previously described with and illustrated in FIG. 1. The circuit 200 may provide an output current Iout that is independent of temperature. The current generator 210 may receive a voltage Vin from the voltage generator 205. The voltage Vin may be received by the inverting input of an operational amplifier (op-amp) 235. The output of the op-amp 235 may be provided to the gate of a transistor 240. The transistor 240 may be a p-channel transistor or other transistor type. The drain of the transistor 240 may be coupled to a resistance 260. The resistance 260 may be coupled in parallel to a leg 280. The leg 280 includes a second resistance 250, which is coupled in series with a diode 255. The diode 255 is coupled to a voltage reference, for example, ground. The drain of transistor 240 may be further coupled to the non-inverting input of the op-amp 235. A voltage Vfb may be measured at the non-inverting input of the op-amp 235. A second transistor 245 may be coupled to the gate of transistor 240. The second transistor 245 may be a p-channel transistor or other transistor type. The sources of the transistors 240, 245 may be coupled to a voltage source. An output current Iout may be provided by the transistor 245. The output current Iout may be temperature independent, as will be described below.

Still referring to FIG. 2, the voltage generator 205 may be a temperature independent voltage generator known in the art or a novel voltage generator. In the example embodiment of a voltage generator 205 illustrated in FIG. 2, the voltage generator 205 is a band gap voltage generator. Resistance 204 is coupled to resistance 212 and the inverting input of operational amplifier 230. Resistance 204 is further coupled to the output of op-amp 230 and leg 270, which includes resistance 220 and diode 225. Resistance 212 is coupled to the inverting input of op-amp 230 and is further coupled to the diode 215. Resistance 220 is coupled to the non-inverting input of op-amp 230 and diode 225. The magnitude of resistance for the resistances 204, 212, 220 may be chosen to provide the desired value of the voltage Vin. For example, if the desired voltage Vin=1.25 V, resistance 212 may be selected to be 10KΩ, and resistances 204, 220 may be selected to be 100KΩ. The resistance 250 and diode 255 in leg 280 of the current generator 210 may be selected to match the resistance 220 and diode 225 in leg 270 of the voltage generator 205. That is, the electrical characteristics of the resistance 250 are similar to the electrical characteristics of the resistance 220, and the electrical characteristics of diode 225 are similar to the electrical characteristics of the diode 255. This may allow Vfb to equal Vin. In some embodiments, the resistance 250 and diode 255 in leg 280 and the resistance 220 and diode 225 in leg 270 may have identical electrical characteristics.

The resistances 250, 260 may represent components of the current generator 210. The resistances 250, 260 may correspond to the components 115*a*, 115*b* included in the current generator 110 of FIG. 1. The resistance of resistance 250 may decrease with increases in temperature. This may cause a resistor current Iptat across resistance 250 to increase as temperature increases. However, output current Iout may be prevented from changing in response to changes in resistance current Iptat by resistance 260. In contrast to resistance 250, the resistance of resistance 260 may increase as temperature increases. This may cause a resistance current Ictat across resistance 260 to decrease as temperature increases.

In some embodiments, resistance 250 and diode 255 correspond to component 115*a*. Resistances 250, 260 may respond similarly to changes in temperature. A voltage drop across the diode 255 may change as temperature changes. For example, the voltage drop across the diode 255 may decrease as temperature increases, and the resistance of resistances 250,260 may both increase as temperature increases. The rate of the voltage drop across the diode 255 in response to the increase in temperature may be such that the resistance current Iptat may increase as temperature increase. The resistance current Icat may decrease with increase in temperature as described in the previous paragraph. This may prevent output current Iout from changing in response to changes in temperature.

Figure 3:
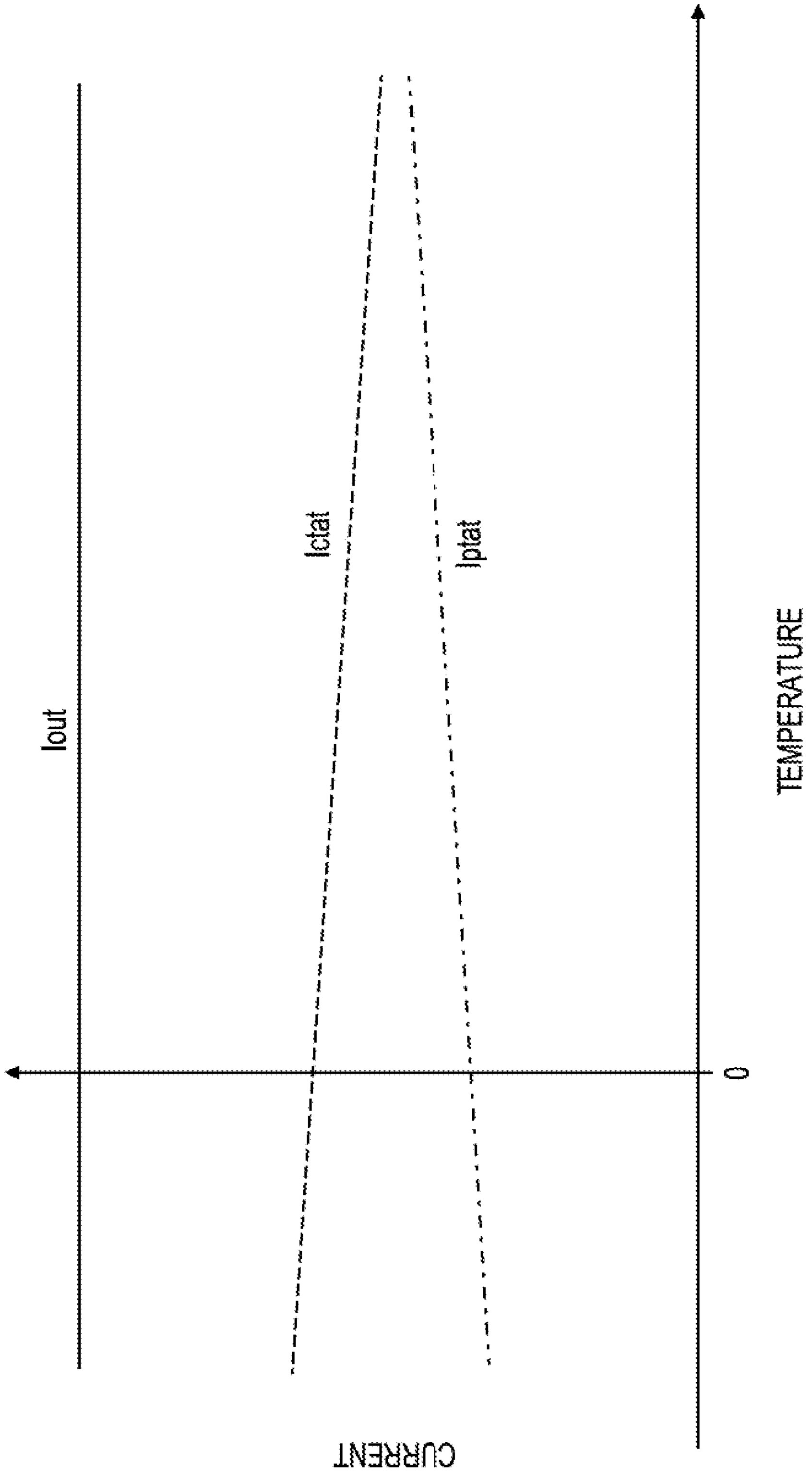
FIG. 3 is a plot of currents in a circuit over a range of temperatures according to an embodiment of the invention.

When resistance current Ictat changes at the same rate resistance current Iptat changes, but in the opposite direction, the output current Iout may be constant over a range of temperatures. This principle is illustrated in FIG. 3. The resistance currents Ictat and Iptat are illustrated over a range of temperatures. Although both resistance currents Ictat and Iptat vary over the temperature range, the sum of currents Ictat and Iptat remains constant, resulting in output current Iout that is independent of temperature.

The resistance of resistance 260 may be chosen such that its change in resistance with temperature directly mirrors the change in resistance with temperature of resistance 250. The resistances 250 and 260 may include different materials that respond differently to changes in temperature. The resistance value chosen for resistance 260 may depend on the material properties of resistances 250, 260. For example, the resistance 250 may be 100kΩ and cause resistance current Iptat to increase by 0.35 uA/100° C. Resistance 260 may be a long path of $N^+$ doping in a p-substrate, often referred to as a "Naa" resistance. The resistance 260 may cause resistance current Ictat to decrease by −1.6 uA/100° C. Resistance current Ictat may counteract resistance current Iptat when the resistance of resistance 260 is 450KΩ. In some embodiments, the current generator 210 may be manufactured with a trimmable resistance 260. This may allow for the resistance of resistance 260 to be tuned to the properties of resistance 250 after manufacture of the current generator 210. Resistance 260 may be trimmed as part of the manufacturing process of a product or may be left untrimmed to allow a user to tune resistance 260 at a later time.

The circuit 200 may consume less power and layout area than other temperature independent current generators. The circuit 200 may also provide an output current with less variability than other current generators. For example, for the resistance values of the example previously described in reference to FIG. 2, the circuit 200 may consume approximately 20 uA of current and 200 um×100 um of layout area. Different current consumption and layout areas may be possible based, at least in part, on the components chosen for the voltage and current generators.

Figure 4:
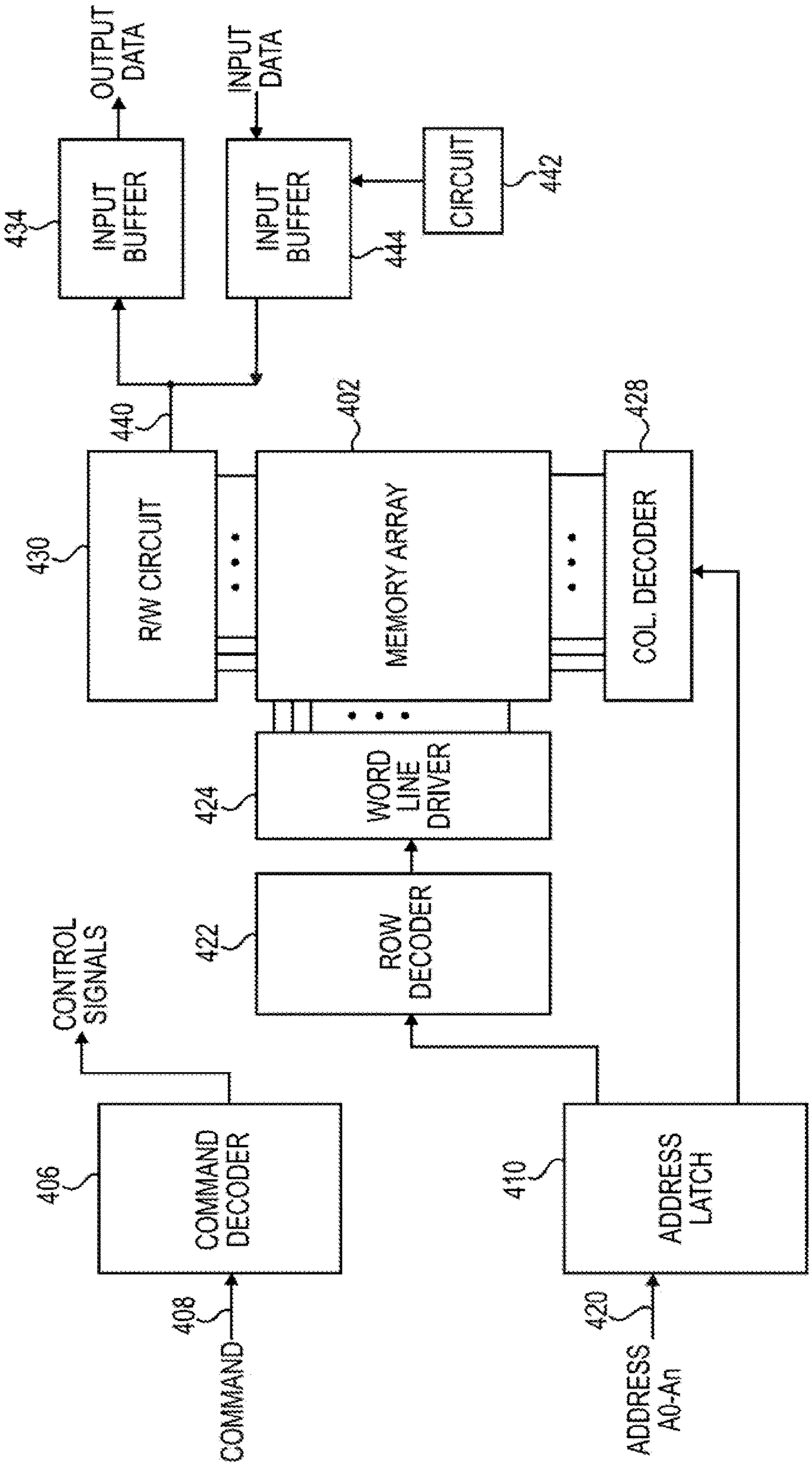
FIG. 4 is a block diagram of a portion of a memory according to an embodiment of the invention.

FIG. 4 is a block diagram of a portion of a memory which may contain the circuit 200 according to an embodiment of the present invention. The memory 400 includes an array 402 of memory cells, which may be, for example, volatile memory cells (e.g., DRAM memory cells, SRAM memory cells, etc.), non-volatile memory cells (e.g., flash memory cells, PCM cells, etc.), or some other types of memory cells.

The memory 400 includes a command decoder 406 that receives memory commands through a command bus 408 and generates corresponding control signals within the memory 400 to carry out various memory operations. The command decoder 406 responds to memory commands applied to the command bus 408 to perform various operations on the memory array 402. For example, the command decoder 406 is used to generate internal control signals to read data from and write data to the memory array 402. Row and column address signals are applied to the memory 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output buffer 434 via an input-output data bus 440. Write data are applied to the memory array 402 through a data input buffer 444 and the memory array read/write circuitry 430. The memory may include a circuit 442 that provides a bias current for an input buffer of the memory 400 such as input buffer 444. For example, the circuit 442 may include the circuit 200 of FIG. 2, or any circuit according to an embodiment of the disclosed invention.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus, comprising:

a voltage generator configured to provide a voltage, the voltage generator comprising:

an operational amplifier configured to receive the voltage at an inverting input of the operational amplifier;

a voltage generator resistance coupled to a non-inverting input of the operational amplifier; and a first diode coupled to the non-inverting input of the operational amplifier and the voltage generator resistance a current generator coupled to the voltage generator and configured to provide a current based on the voltage from the voltage generator, wherein the current generator includes a first component that has a property that increases as temperature increases and a second component that has the property that decreases as temperature increases, wherein a first current across the first component and a second current across the second component are derived from the voltage of the voltage generator, and wherein the second component is configured to decrease the property at a rate equal to a rate that the first component increases the property and wherein a resistance of the second component matches the voltage generator resistance, and wherein the second component is coupled to a second diode with electrical characteristics that match electrical characteristics of the first diode.

2. The apparatus of claim 1, wherein the first and second components are resistors.

3. The apparatus of claim 2, wherein the second diode is coupled to a reference voltage.

4. The apparatus of claim 2, wherein the property is resistance.

5. The apparatus of claim 2, wherein the first component comprises a different material from the second component.

6. The apparatus of claim 1, further comprising an input buffer associated with a memory, wherein the input buffer is configured to receive the current from the current generator.

7. The apparatus of claim 1, wherein the resistance of the second component and the voltage generator resistance are identical.

8. An apparatus, comprising:

a voltage generator configured to provide a voltage, the voltage generator comprising:

an operational amplifier configured to receive the voltage at an inverting input of the operational amplifier;

a voltage generator resistance coupled to a non-inverting input of the operational amplifier; and a first diode coupled to the non-inverting input of the operational amplifier and the voltage generator resistance;

a first transistor, a gate of the first transistor coupled to an output of the operational amplifier;

a second transistor, a gate of the second transistor coupled to the output of the operational amplifier;

a first resistance coupled to a drain of the first transistor;

a second resistance coupled to the drain of the first transistor, wherein the second resistance, the first resistance, and the drain of the first transistor are further coupled to a non-inverting input of the operational amplifier; and a second diode coupled in series with the second resistance, wherein the second resistance and the second diode are matched, respectively, to the voltage generator resistance and the first diode.

9. The apparatus of claim 8, wherein an output current is provided by the second transistor.

10. The apparatus of claim 9, wherein the first resistance and the second resistance are configured to maintain the output current provided by the second transistor constant over a temperature range.

11. The apparatus of claim 8, wherein the first current across the first resistance decreases as temperature increases and the second current across the second resistance increases as temperature increases.

12. The apparatus of claim 8, wherein the voltage generator further comprises:

a third resistance coupled to the inverting input of the operational amplifier and further coupled to the output of the operational amplifier;

a fourth resistance coupled to the inverting input; and a third diode coupled to the fourth resistance and a ground voltage.

13. The apparatus of claim 12, wherein the first and second transistors comprise p-channel transistors.

14. The apparatus of claim 8, wherein the first resistance is a Naa resistor.

15. The apparatus of claim 8, wherein the first resistance is trimmable.

16. The apparatus of claim 8, wherein the second resistance and the voltage generator resistance are the same.

17. An apparatus, comprising:

a voltage generator including an operational amplifier, and a voltage generator resistance component including a voltage generator resistance and a voltage generator diode coupled to a non-inverting input of the operational amplifier, the voltage generator configured to provide a voltage; and a current generator coupled to the voltage generator, wherein the current generator is configured to provide output current based on the voltage, the current generator comprising:

a first resistance coupled to a node that increases as temperature increases; and a second resistance coupled to the node to receive a same voltage as the first resistance, wherein the second resistance decreases as temperature increases, wherein the second resistance is configured to decrease at a rate equal to a rate that the first resistance increases, and wherein the second resistance matches the voltage generator resistance, wherein a first current across the first resistance and a second current across the second resistance are derived from the voltage provided by the voltage generator.

18. The apparatus of claim 17, wherein the current generator includes a diode coupled to the first resistance, wherein electrical characteristics of the diode configured to match electrical characteristics of the voltage generator diode.

19. The apparatus of claim 17, wherein the first resistance is 450kΩ, the second resistance is 100kΩ, and the voltage generator resistance is 100kΩ.

20. The apparatus of claim 17, wherein the output current is independent of temperature.

21. The apparatus of claim 17, wherein the voltage generator comprises a band gap voltage generator configured to provide a band gap voltage to the current generator.

* * * * *